(12) United States Patent
Liu et al.

(10) Patent No.: US 8,413,020 B2
(45) Date of Patent: Apr. 2, 2013

(54) SYSTEMS AND METHODS FOR RETIMED VIRTUAL DATA PROCESSING

(75) Inventors: Jinfeng Liu, Longmont, CO (US); Hongwei Song, Longmont, CO (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/570,050

(22) Filed: Aug. 8, 2012

(65) Prior Publication Data

US 2012/0324307 A1  Dec. 20, 2012

Related U.S. Application Data

(63) Continuation of application No. 12/540,283, filed on Aug. 12, 2009, now Pat. No. 8,266,505.

(51) Int. Cl.
*H03M 13/00* (2006.01)
(52) U.S. Cl. ........................................ 714/775
(58) Field of Classification Search .................. 714/744, 714/746, 751–755, 786, 798, 819
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler |
| 5,802,069 A | 9/1998 | Coulson et al. |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.
U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.

(Continued)

*Primary Examiner* — Nadeem Iqbal
(74) *Attorney, Agent, or Firm* — Hamilton DeSanctis & Cha

(57) ABSTRACT

Various embodiments of the present invention provide systems and methods for data processing system. As one example, a data processing circuit is described that includes an analog to digital converter, an online timing loop, and an offline timing loop. The analog to digital converter receives an analog input and provides a first series of data samples Each bit of the first series of data samples corresponds to the analog input at a time controlled by an updated sampling clock. The online timing loop modifies the updated sampling clock based at least in part upon a processed version of the first series of data samples.

21 Claims, 6 Drawing Sheets

U.S. PATENT DOCUMENTS

| | | | |
|---|---|---|---|
| 5,978,414 | A | 11/1999 | Nara |
| 5,983,383 | A | 11/1999 | Wolf |
| 6,005,897 | A | 12/1999 | McCallister et al. |
| 6,023,783 | A | 2/2000 | Divsalar et al. |
| 6,029,264 | A | 2/2000 | Kobayashi et al. |
| 6,041,432 | A | 3/2000 | Ikeda |
| 6,065,149 | A | 5/2000 | Yamanaka |
| 6,097,764 | A | 8/2000 | McCallister et al. |
| 6,145,110 | A | 11/2000 | Khayrallah |
| 6,216,249 | B1 | 4/2001 | Bliss et al. |
| 6,216,251 | B1 | 4/2001 | McGinn |
| 6,229,467 | B1 | 5/2001 | Eklund et al. |
| 5,317,472 | A1 | 6/2001 | Choi et al. |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,381,726 | B1 | 4/2002 | Weng |
| 6,438,717 | B1 | 8/2002 | Butler et al. |
| 6,473,878 | B1 | 10/2002 | Wei |
| 6,476,989 | B1 | 11/2002 | Chainer et al. |
| 6,625,775 | B1 | 9/2003 | Kim |
| 6,657,803 | B1 | 12/2003 | Ling et al. |
| 6,671,404 | B1 | 12/2003 | Katawani et al. |
| 6,697,977 | B2 | 2/2004 | Ozaki et al. |
| 6,748,034 | B2 | 6/2004 | Hattori et al. |
| 6,757,862 | B1 | 6/2004 | Marianetti, II |
| 6,785,863 | B2 | 8/2004 | Blankenship et al. |
| 6,788,654 | B1 | 9/2004 | Hashimoto et al. |
| 6,810,502 | B2 | 10/2004 | Eidson |
| 6,980,382 | B2 | 12/2005 | Hirano et al. |
| 6,986,098 | B2 | 1/2006 | Poeppelman |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,073,118 | B2 | 7/2006 | Greenberg et al. |
| 7,093,179 | B2 | 8/2006 | Shea |
| 7,113,356 | B1 | 9/2006 | Wu |
| 7,136,244 | B1 | 11/2006 | Rothbert |
| 7,173,783 | B1 | 2/2007 | McEwen et al. |
| 7,184,486 | B1 | 2/2007 | Wu et al. |
| 7,191,378 | B2 | 3/2007 | Eroz et al. |
| 7,203,015 | B2 | 4/2007 | Sakai et al. |
| 7,203,887 | B2 | 4/2007 | Eroz et al. |
| 7,236,757 | B2 | 6/2007 | Raghaven et al. |
| 7,257,764 | B2 | 8/2007 | Suzuki et al. |
| 7,310,768 | B2 | 12/2007 | Eidson et al. |
| 7,313,750 | B1 | 12/2007 | Feng et al. |
| 7,333,532 | B2 * | 2/2008 | Baltersee et al. ............ 375/148 |
| 7,370,258 | B2 | 5/2008 | Iancu et al. |
| 7,403,752 | B2 | 7/2008 | Raghaven et al. |
| 7,430,256 | B2 | 9/2008 | Zhidkov |
| 7,502,189 | B2 | 3/2009 | Sawaguchi et al. |
| 7,505,537 | B1 | 3/2009 | Sutardja |
| 7,523,375 | B2 | 4/2009 | Spencer |
| 7,509,927 | B2 | 9/2009 | Shin et al. |
| 7,587,657 | B2 | 9/2009 | Haratsch |
| 7,590,168 | B2 | 9/2009 | Raghaven et al. |
| 7,702,989 | B2 | 4/2010 | Graef et al. |
| 7,712,008 | B2 | 5/2010 | Song et al. |
| 7,738,201 | B2 | 6/2010 | Jin et al. |
| 7,752,523 | B1 | 7/2010 | Chaichanavong |
| 7,801,200 | B2 | 9/2010 | Tan |
| 7,802,163 | B2 | 9/2010 | Tan |
| 8,266,505 | B2 * | 9/2012 | Liu et al. ............ 714/775 |
| 2001/0017904 | A1 | 8/2001 | Pukkila et al. |
| 2003/0063405 | A1 | 4/2003 | Jin et al. |
| 2003/0081693 | A1 | 5/2003 | Raghaven et al. |
| 2003/0087634 | A1 | 5/2003 | Raghaven et al. |
| 2003/0112896 | A1 | 6/2003 | Raghaven et al. |
| 2003/0134607 | A1 | 7/2003 | Raghaven et al. |
| 2004/0071206 | A1 | 4/2004 | Takatsu |
| 2004/0098659 | A1 | 5/2004 | Bjerke et al. |
| 2005/0010855 | A1 | 1/2005 | Lusky |
| 2005/0078399 | A1 | 4/2005 | Fung |
| 2005/0111540 | A1 | 5/2005 | Modrie et al. |
| 2005/0157780 | A1 | 7/2005 | Werner et al. |
| 2005/0195749 | A1 | 9/2005 | Elmasry et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0098719 | A1 * | 5/2006 | Baltersee et al. ............ 375/148 |
| 2006/0123285 | A1 | 6/2006 | De Araujo et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0210002 | A1 | 9/2006 | Yang et al. |
| 2006/0248435 | A1 | 11/2006 | Haratsch |
| 2006/0256670 | A1 | 11/2006 | Park et al. |
| 2006/0265634 | A1 | 11/2006 | Silvus et al. |
| 2007/0011569 | A1 | 1/2007 | Vila Casado et al. |
| 2007/0047121 | A1 | 3/2007 | Elefeheriou et al. |
| 2007/0047635 | A1 | 3/2007 | Stojanovic et al. |
| 2007/0110200 | A1 | 5/2007 | Mergen et al. |
| 2007/0230407 | A1 | 10/2007 | Petrie et al. |
| 2007/0286270 | A1 | 12/2007 | Huang et al. |
| 2008/0049825 | A1 | 2/2008 | Chen et al. |
| 2008/0055122 | A1 | 3/2008 | Tan |
| 2008/0065970 | A1 | 3/2008 | Tan |
| 2008/0069373 | A1 | 3/2008 | Jiang et al. |
| 2008/0168330 | A1 | 7/2008 | Graef et al. |
| 2008/0276156 | A1 | 11/2008 | Gunnam |
| 2008/0301521 | A1 | 12/2008 | Gunnam |
| 2010/0101578 | A1 | 4/2009 | Zongwang et al. |
| 2009/0132893 | A1 | 5/2009 | Miyazaki et al. |
| 2009/0185643 | A1 | 7/2009 | Fitzpatrick |
| 2009/0199071 | A1 | 8/2009 | Graef |
| 2009/0235116 | A1 | 9/2009 | Tan et al. |
| 2009/0235146 | A1 | 9/2009 | Tan |
| 2009/0259915 | A1 | 10/2009 | Livshitz et al. |
| 2009/0273492 | A1 | 11/2009 | Yang et al. |
| 2009/0274247 | A1 | 11/2009 | Galbraith et al. |
| 2010/0002795 | A1 | 1/2010 | Raghaven et al. |
| 2010/0042877 | A1 | 2/2010 | Tan |
| 2010/0042890 | A1 | 2/2010 | Gunam |
| 2010/0050043 | A1 | 2/2010 | Savin |
| 2010/0061492 | A1 | 3/2010 | Noelder |
| 2010/0070837 | A1 | 3/2010 | Xu et al. |
| 2010/0164764 | A1 | 7/2010 | Nayak |
| 2010/0185914 | A1 | 7/2010 | Tan et al. |
| 2011/0041028 | A1 * | 2/2011 | Liu et al. ............ 714/752 |
| 2011/0075569 | A1 | 3/2011 | Marrow et al. |
| 2011/0080211 | A1 | 4/2011 | Yang et al. |
| 2011/0093517 | A1 * | 4/2011 | Liu et al. ............ 708/207 |
| 2011/0167246 | A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/901,816, filed Oct. 11, 2010, Li et al.
U.S. Appl. No. 12/901,742, filed Oct. 11, 2010, Yang.
U.S. Appl. No. 12/917,756, filed Nov. 2, 2010, Miladinovic et al.
U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
U.S. Appl. No. 12/992,948, filed Nov. 16, 2010, Yang et al.
U.S. Appl. No. 13/021,814, filed Feb. 7, 2011, Jin, Ming et al.
U.S. Appl. No. 13/031,818, filed Feb. 22, 2011, Xu, Changyou et al.
U.S. Appl. No. 13/050,129, filed Mar. 17, 2011, Tan et al.
U.S. Appl. No. 13/050,765, filed Mar. 17, 2011, Yang et al.
U.S. Appl. No. 13/088,119, filed Apr. 15, 2011, Zhang et al.
U.S. Appl. No. 13/088,146, filed Apr. 15, 2011, Li et al.
U.S. Appl. No. 13/088,178, filed Apr. 15, 2011, Sun et al.

U.S. Appl. No. 13/126,748, filed Apr. 28, 2011, Tan.
U.S. Appl. No. 13/167,764, filed Jun. 24, 2011, Li, Zongwang et al.
U.S. Appl. No. 13/167,771, filed Jun. 24, 2011, Li, Zongwang et al.
U.S. Appl. No. 13/167,775, filed Jun. 24, 2011, Li, Zongwang.
U.S. Appl. No. 13/186,146, filed Jul. 19, 2011, Mathew et al.
U.S. Appl. No. 13/186,213, filed Jul. 19, 2011, Mathew et al.
U.S. Appl. No. 13/186,234, filed Jul. 19, 2011, Xia, Haitao et al.
U.S. Appl. No. 13/186,251, filed Jul. 19, 2011, Xia, Haitao et al.
U.S. Appl. No. 13/186,174, filed Jul. 19, 2011, Mathew et al.
U.S. Appl. No. 13/186,197, filed Jul. 19, 2011, Mathew, George et al.
U.S. Appl. No. 13/213,751, filed Aug. 19, 2011, Zhang, Fan et al.
U.S. Appl. No. 13/213,808, filed Aug. 19, 2011, Jin, Ming.
U.S. Appl. No. 13/220,142, filed Aug. 29, 2011, Chang, Wu et al.
U.S. Appl. No. 13/227,538, filed Sep. 8, 2011, Yang, Shaohua et al.
U.S. Appl. No. 13/227,544, filed Sep. 8, 2011, Yang, Shaohua et al.
U.S. Appl. No. 13/239,683, filed Sep. 22, 2011, Xu, Changyou.
U.S. Appl. No. 13/239,719, filed Sep. 22, 2011, Xia, Haitao et al.
U.S. Appl. No. 13/251,342, filed Oct. 2, 2011, Xia, Haitao et al.
U.S. Appl. No. 13/269,832, filed Oct. 10, 2011, Xia, Haitao et al.
U.S. Appl. No. 13/269,852, filed Oct. 10, 2011, Xia, Haitao et al.
U.S. Appl. No. 13/284,819, filed Oct. 28, 2011, Tan, Weijun et al.
U.S. Appl. No. 13/284,730, filed Oct. 28, 2011, Zhang, Fan et al.
U.S. Appl. No. 13/284,754, filed Oct. 28, 2011, Zhang, Fan et al.
U.S. Appl. No. 13/284,767, filed Oct. 28, 2011, Zhang, Fan et al.
U.S. Appl. No. 13/284,826, filed Oct. 28, 2011, Tan, Weijun et al.
U.S. Appl. No. 13/295,150, filed Nov. 14, 2011, Li, Zongwang et al.
U.S. Appl. No. 13/295,160, filed Nov. 14, 2011, Li, Zongwang et al.
U.S. Appl. No. 13/251,340, filed Oct. 3, 2011, Xia, Haitao et al.
U.S. Appl. No. 13/570,050, filed Aug. 8, 2012, Liu et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on Communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding" [online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lim et al. "Convergence Analysis of Constrained Joint Adaptation in Recording Channels" IEEE Trans. on Signal Processing vol. 54, No. Jan. 1, 2006.

Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Wu, et al., "Equation Based LDPC Decoder for Intersymbol Interference Channels" 2005 IEEE International Conf. on Acoustics, Speech, and Signal Processing vol. 5 Mar. 2005.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. On Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR RETIMED VIRTUAL DATA PROCESSING

CROSS REFERENCE TO RELATED APPLICATIONS

The present application claims priority to (is a continuation of) U.S. patent application Ser. No. 12/540,283 entitled "Systems and Methods for Retimed Virtual Data Processing", and filed Aug. 12, 2009 now U.S. Pat. No. 8,266,505 by Liu et al. The entirety of the aforementioned application is incorporated herein by reference for all purposes.

BACKGROUND OF THE INVENTION

The present invention is related to data processing systems, and more particularly to systems and methods for retimed virtual data processing.

Existing data processing systems receive a series of data that includes various imbedded synchronization and timing information. The series of data is sampled using a sampling clock. The synchronization and timing information is provided to a timing loop that operates to correct the phase and frequency of the sampling clock. FIG. 1 shows an exemplary timing recovery circuit 100 including a phase detector 110 that receives a data processing output 105 and a data processing input 107. Data processing output 105 is the output received from a data processing circuit, and data processing input 107 is the input to the data processing circuit from which data processing output 105 is derived. Phase detector 110 provides a phase error based on a comparison of data processing output 105 and data processing input 107. The phase error is filtered using a loop filter 120, and the filtered phase error is interpolated using an interpolator 130 that is fed by a time based generator 140 to yield an updated sampling clock 109. Updated sampling clock 109 is used to sample the received series of data. Such loops exhibit latency from when the input data is received until the updated sampling clock is available for sampling future received data.

Hence, for at least the aforementioned reasons, there exists a need in the art for advanced systems and methods for timing recovery in a data processing system.

BRIEF SUMMARY OF THE INVENTION

The present invention is related to data processing systems, and more particularly to systems and methods for retimed virtual data processing.

Various embodiments of the present invention provide data processing circuits that include an analog to digital converter, an online timing loop, and an offline timing loop. The analog to digital converter receives an analog input and provides a first series of data samples Each bit of the first series of data samples corresponds to the analog input at a time controlled by an updated sampling clock. The online timing loop modifies the updated sampling clock based at least in part upon a processed version of the first series of data samples. The offline timing loop interpolates a derivative of the first series of data samples to yield a second series of data samples that mimics a series of data samples corresponding to the analog input that were sampled using a free running clock. The second series of data samples is interpolated to adjust each bit in accordance with an average frequency offset exhibited across the second series of data samples.

In some instances of the aforementioned embodiments, the data processing circuit further includes a data detector circuit that applies a data detection algorithm to a derivative of the first series of data samples to yield a third series of data samples. In such instances, the online timing loop modifies the updated sampling clock based on a phase error value derived by comparing the derivative of the first series of data samples to the third series of data samples. In particular instances of the aforementioned embodiments, the derivative of the first series of data samples is a filtered version of the first series of data samples. In one or more instances of the aforementioned embodiments, the detector circuit is a MAP detector circuit. In various instances of the aforementioned embodiments, the data detector circuit is a first data detector circuit, and the offline timing loop includes: a digital interpolator circuit, a second data detector circuit, a phase detector circuit, and a loop filter. The digital interpolator circuit receives the second series of data samples and provides an interpolated series of data samples. The second data detector circuit applies a data detection algorithm to a derivative of the interpolated series of data samples to yield a fourth series of data samples. The phase detector circuit determines a phase error by comparing the derivative of the interpolated series of data samples with a fourth series of data samples. The loop filter filters the phase error to yield a phase offset value that governs a phase offset applied by the digital interpolator circuit.

In some cases, the derivative of the interpolated series of data samples is the interpolated series of data samples. In other cases, the derivative of the interpolated series of data samples is a filtered version of the interpolated series of data samples. In particular cases, the data processing circuit further includes a data decoder circuit, and an interleaver memory. The data decoder circuit applies a data decoding algorithm to a decoder input and provides a data output. The interleaver memory provides either the fourth series of data samples or the third series of data samples as the decoder input depending upon whether online or offline processing is selected. In some cases, application of the data detection algorithm to the derivative of the interpolated series of data samples by the second data detector circuit is based at least in part on the data output.

Other embodiments of the present invention provide methods for data processing that include receiving an analog input; converting the analog input into a first series of data samples such that each bit of the first series of data samples corresponds to the analog input at a time controlled by an updated sampling clock; modifying the updated sampling clock based at least in part upon a processed version of the first series of data samples; interpolating a derivative of the first series to reverse an effect of modifying the updated sampling clock such that a first interpolated series of data samples is provided that mimics a series of data samples corresponding to the analog input that were sampled using a free running clock; and interpolating the first interpolated series of data samples to adjust each bit in accordance with an average frequency offset exhibited across the first interpolated series of data samples to yield a second interpolated series of data samples. In some instances of the aforementioned embodiments, the derivative of the first series of data samples is the first series of data samples. In other instances, the derivative of the first series of data samples is a filtered version of the first series of data samples.

Various instances of the aforementioned embodiments further include applying a first data detection algorithm to a derivative of the first series of data samples to yield a third series of data samples. In such instances, modifying the updated sampling clock is based on a first phase error value derived by comparing the derivative of the first series of data samples to the third series of data samples. The methods further include applying a second data detection algorithm to the second interpolated series of data samples to yield a detector output. In such instances, interpolating the first interpolated series of data samples to adjust each bit in accordance with an average frequency offset exhibited across the first interpolated series of data samples to yield a second interpolated series of data samples is based at least on a second phase error value derived by comparing the second interpolated series of data samples to the detector output. In various instances, the methods further include selecting either the detector output or the third series of data samples as a decoder input; and applying a decoder algorithm to the decoder input to yield a data output. In other instances, the methods further include applying the second data detection algorithm relies at least in part on the data output.

Yet other embodiments of the present invention provides hard disk drive systems. Such systems include a storage medium; a read/write head assembly disposed in relation to the storage medium; an analog to digital converter; an online timing loop; and an offline timing loop. The analog to digital converter receives an analog input via the read/write head assembly. The analog to digital converter provides a first series of data samples, and wherein each bit of the first series of data samples corresponds to the analog input at a time controlled by an updated sampling clock. The online timing loop modifies the updated sampling clock based at least in part upon a processed version of the first series of data samples. The offline timing loop interpolates a derivative of the first series of data samples to yield a second series of data samples. The second series of data samples mimics a series of data samples corresponding to the analog input that were sampled using a free running clock; and wherein the second series of data samples is interpolated to adjust each bit in accordance with an average frequency offset exhibited across the second series of data samples.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to data processing systems, and more particularly to systems and methods for retiming virtual data processing.

Figure 2A:
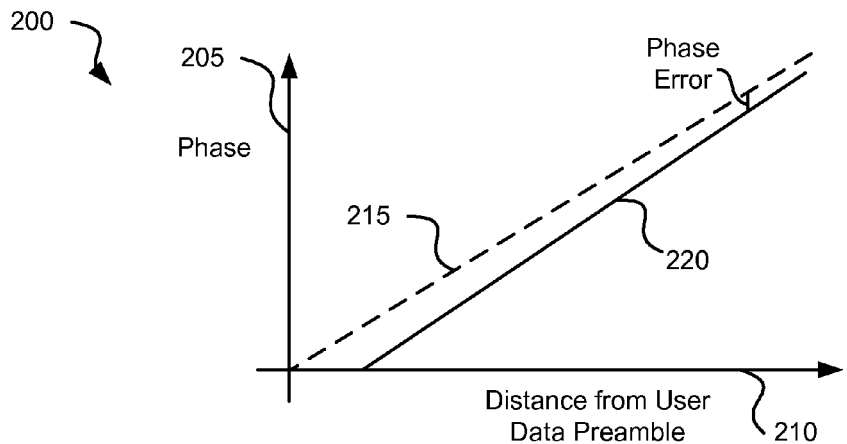
FIG. 2A graphically shows a determined operation of a timing recovery circuit with a low gain.

Various problems have been found with the use of existing timing loop circuits. For example, where the gain of the loop is set to small, any error may not be corrected in a reasonable period. An example of this is graphically depicted in FIG. 2A where phase 205 is plotted verses a distance from the user preamble in a series of data 210. As shown, an expected phase line 215 is shown as a dashed line representing a set of input data where the phase is gradually increased as each bit is received. A solid line 220 represents the tracked sampling phase generated by a timing loop circuit. As shown, where the loop gain is set too low, it takes a very long time to correct the phase error. This results in a mis-sampling of all bits, which may be recoverable using downstream data detection and data decoding processes. However, where the sampling is too bad, the data set may not be recoverable. The time required to correct the phase error may be longer than any synchronization and timing information available in the input stream. To address this, the amount of synchronization and timing information may be increased to give a greater opportunity to correct the phase error. Such an approach, however, decreases the user data density as more bit periods are dedicated to the overhead of synchronization and timing information.

Figure 2B:
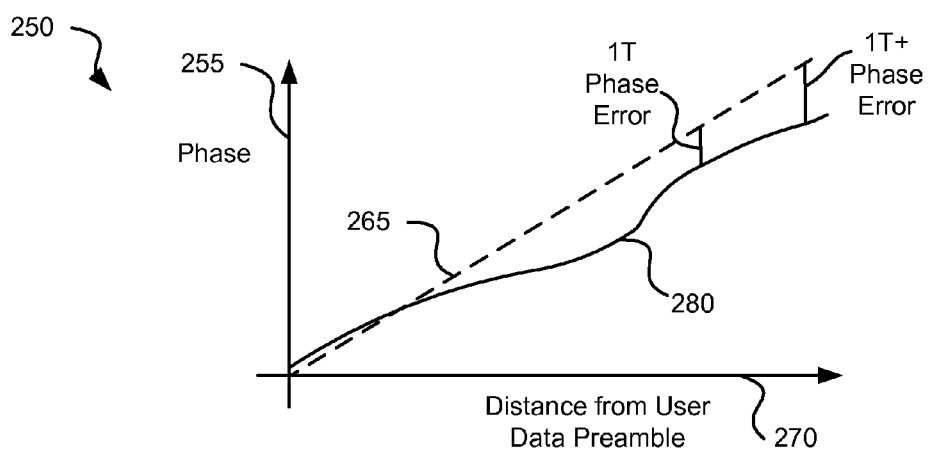
FIG. 2B graphically shows a determined operation of a timing recovery circuit with a high gain.

Another approach is to increase the gain of the loop allowing for correction using reduced synchronization and timing information. It has been found that this can result in a catastrophic failure as the phase correction slips forward or backward as the timing loop attempts to correct the phase error. An example of this is graphically depicted in FIG. 2B where phase 255 is plotted verses a distance from the user preamble in a series of data 270. As shown, an expected phase line 265 is shown as a dashed line representing a set of input data where the phase is gradually increased as each bit is received. A solid line 280 represents the tracked sampling phase generated by a timing loop circuit. Toward the end of the processing of the series of data, the frequency offset is estimated reasonably well by the timing loop circuit, but the phase estimate is incorrect by a significant amount. As shown, where the loop gain is set too high, various over corrections occur, and in some cases where the noise is too high such as at a point 280, an over correction results in correcting to the correct phase, albeit displaced by an entire 1T cycle. This results in a misplacement of each subsequently sampled bit into an incorrect sampling position. This effect is generally referred to herein as a "bit slip". In exemplary existing data processing systems, such a bit slip is not recoverable.

Figure 3:
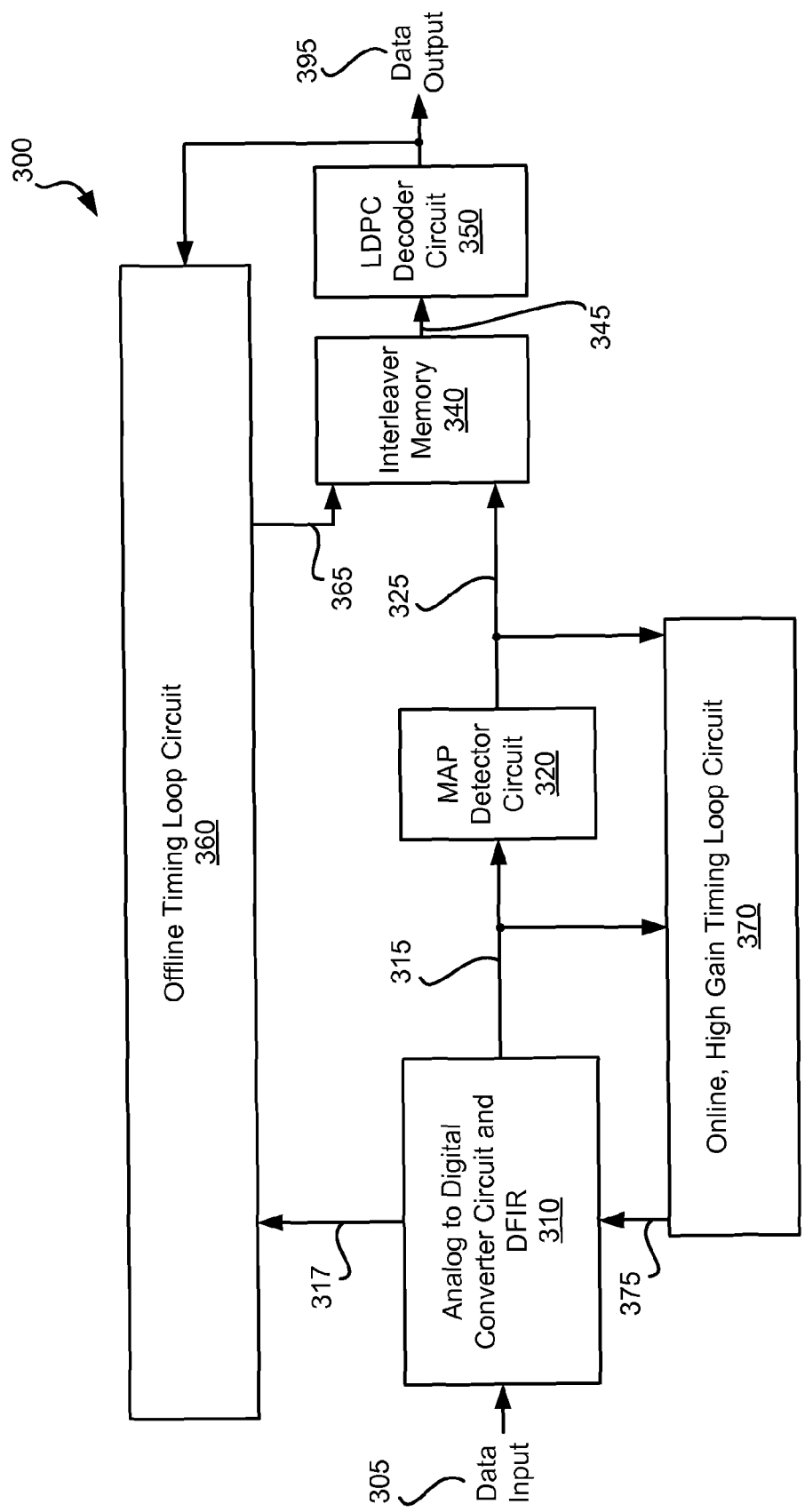
FIG. 3 shows a data processing circuit including a retimed virtual processing circuit in accordance with some embodiments of the present invention.

Turning to FIG. 3, a data processing circuit 300 is depicted that includes a retimed virtual processing circuit in accordance with some embodiments of the present invention. Data processing circuit 300 includes an analog to digital converter and DFIR circuit 310 that receives a data input 305. Further, analog to digital converter and DFIR circuit 310 samples data input 305 based upon a sampling clock 375 to yield a series of digital samples corresponding to data input 305. The analog to digital converter may be any circuit that is capable of receiving an analog input signal and providing a series of data samples corresponding thereto. Based upon the disclosure provided herein, one of ordinary skill in the art will recognize a variety of analog to digital conversion circuits that may be used in relation to different embodiments of the present invention. The series of digital data samples are then filtered using a digital finite impulse response filter (DFIR), and the resulting filtered series of data samples is provided as a processing data input 315 to a maximum a posteriori (MAP) detector circuit 320. The DFIR circuit may be any digital finite impulse response filter known in the art. Yet further, other filter circuits known in the art may be used in place of the DFIR circuit. MAP detector circuit 320 performs a MAP detection process as is known in the art on processing data input 315 to yield processing data output 325. MAP detector circuit 320 may be any MAP detector circuit known in the art. Further, in some embodiments of the present invention MAP detector circuit 320 may be replaced by another type of detection circuit such as, for example, a Viterbi algorithm detector circuit.

Figure 1:
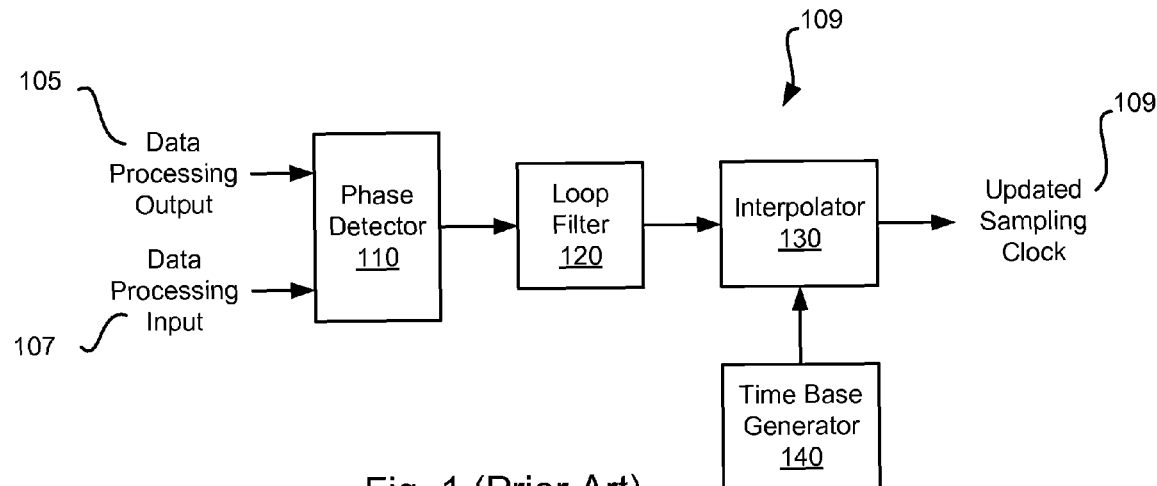
FIG. 1 depicts a prior art timing recovery circuit that may be used in relation to a data processing system.

Both processing data input 315 and processing data output 325 are provided to an online, high gain timing loop circuit 370. Timing loop circuit 370 compares processing data input 315 and processing data output 325 to derive a phase error signal that is in turn used to generate sampling clock 375. Timing loop circuit 370 may be any loop feedback circuit known in the art that is operable to update a sampling clock based upon a phase difference between a processing input and a processing output. Timing loop circuit 370 is referred to as "online" because it seeks to correct any sampling frequency output based upon synchronization and timing information received as part of data input 305 (e.g., acquisition mode on a hard disk drive system). Further, the gain of timing loop circuit 370 may be set to be relatively high to assure its ability to track a frequency of a short period of synchronization and timing information imbedded in data input 305. In one embodiment of the present invention, the synchronization and timing information is between forty and two hundred bit periods in length. In particular embodiments of the present invention, the synchronization and timing information is between sixty and one hundred bit periods in length. As one example, timing loop circuit 370 may be implemented as shown in FIG. 1. Based upon the disclosure provided herein, one of ordinary skill in the art will recognize a variety of timing loop circuits that may be used in relation to different embodiments of the present invention.

A series of digital data samples 317 are provided to an offline timing loop circuit 360. Offline timing loop circuit 360 is operable to retime digital data samples 317 using average frequency error information derived from a data output 395 to correct for any accumulating phase offset that was not corrected by online, high gain timing loop circuit 370. The retiming corrects for any mis-sampling including bit slips that may have occurred during initial data processing. Timing loop circuit 360 is referred to as "offline" as it works on a previously buffered series of data samples and not on data samples directly created from data input 305 (e.g., retry mode in a hard disk drive system). The retimed digital data samples are processed to yield a processing data output 365.

In some cases, both processing data output 325 and processing data output 365 include an indication of a likely value at each bit position corresponding to data input 305, and corresponding soft data indicating a likelihood that the likely value at each bit position is correct. Both processing data output 325 and processing data output 365 are provided to an interleaver memory 340 that is responsible for buffering data, and providing either processing data output 325 or processing data output 365 as an decoder input 345 depending upon whether online or offline processing is selected. Thus, interleaver memory 340 may be implemented as a multiplexer with two buffered inputs. Based upon the disclosure provided herein, one of ordinary skill in the art will recognize a number of implementations for interleaver memory 340 that may be used in relation to different embodiments of the present invention. Decoder input 345 is provided to a low density parity check (LDPC) decoder circuit 350. LDPC decoder circuit 350 applies a decoding algorithm to decoding input 345, and provides the decoded result as data output 395. LDPC decoder circuit 350 may be any LDPC decoder circuit known in the art. Further, it should be noted that LDPC decoder circuit may be replaced with other types of decoder circuits known in the art such as, for example, a Reed Solomon decoder circuit. Based upon the disclosure provided herein, one of ordinary skill in the art will recognize a variety of decoder circuits that may be used in place of LDPC decoder circuit 350 in accordance with different embodiments of the present invention.

In operation, data input 305 is received. Online processing (i.e., on the fly processing) utilizes online, high gain feedback loop 370 to track the bit periods of the stream of data provided as data input 305. Data input 305 continues to be sampled using the analog to digital converter sampling at a rate dictated by sampling clock 375. The data is processed through DFIR, MAP detector circuit 320, and LDPC decoder circuit 350 to yield a data output. In some cases, the processing may be iterative with multiple passes through a data detector circuit and LDPC decoder circuit set(s). Where the data is found to be recoverable, offline processing is not performed.

Alternatively, where the data is not recovered using online processing, offline processing is performed. Such offline processing includes retiming the buffered data samples received during online processing as digital data samples 317, and re-processing the retimed samples using LDPC decoder circuit 350 to determine whether the data can be recovered. Similar to online processing, offline processing can include iterative processing using multiple passes through a data detector circuit and LDPC decoder circuit set(s). Where the failure to recover was due to a bit slip or other sampling error, the retry process offers a reasonable expectation that the data can be recovered.

Figure 4B:
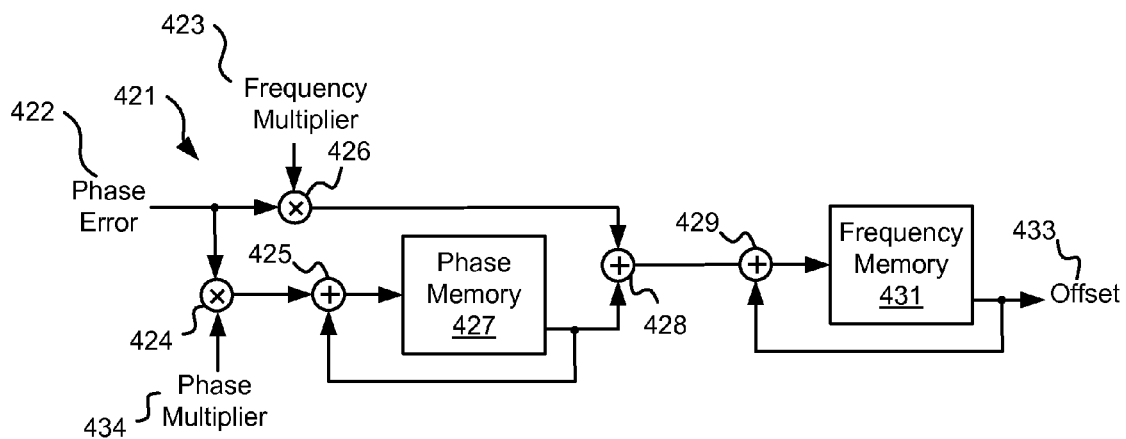
FIG. 4B depicts an exemplary loop filter circuit that may be used in relation to one or more embodiments of the present invention.
Figure 4A:
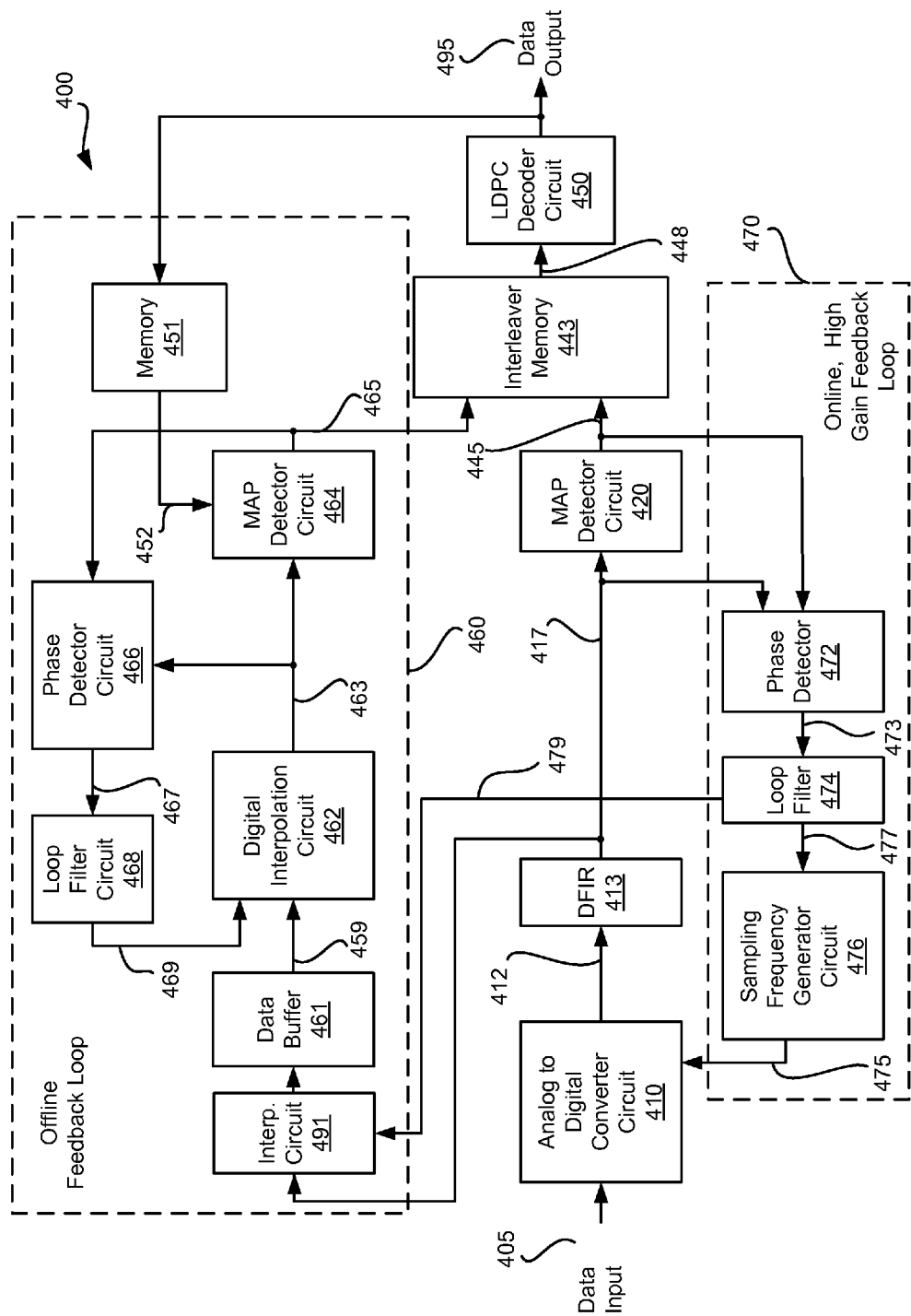
FIG. 4A shows another data processing circuit including a retimed virtual processing circuit in accordance with some embodiments of the present invention.

FIG. 4 shows another data processing circuit 400 including a retimed virtual processing circuit in accordance with some embodiments of the present invention. Data processing circuit 400 includes an analog to digital converter circuit 410 that receives a data input 405. Analog to digital converter 410 sample data input 405 and provides a series of digital samples 412 corresponding to sampling points dictated by a sampling clock 475. Analog to digital converter 410 may be any circuit that is capable of receiving an analog input signal and providing a series of data samples corresponding thereto. Based upon the disclosure provided herein, one of ordinary skill in the art will recognize a variety of analog to digital conversion circuits that may be used in relation to different embodiments of the present invention.

Digital samples 412 are provided to a filter circuit 413. In some embodiments of the present invention, filter circuit 413 is a digital finite impulse response filter as are known in the art. Based upon the disclosure provided herein, one of ordinary skill in the art will recognize a variety of filters that may be used in place of filter 413. Filter circuit 413 filters the received input and provides a series of filtered samples that are provided as a processing data input 417 to a data detector circuit 420. In some embodiments of the present invention, data detector circuit 420 is a maximum a posteriori (MAP) detector circuit as are known in the art. Other types of detector circuits such as, for example, a Viterbi algorithm detector circuit may be used in relation to different embodiments of the present invention. Based upon the disclosure provided herein, one of ordinary skill in the art will recognize a variety of detector circuits that may be used in relation to different embodiments of the present invention. Detector circuit 420 performs a detection process as is known in the art on processing data input 417 to yield a processing data output 445.

Both processing data input 417 and processing data output 445 are provided to an online, high gain timing loop circuit 470. Timing loop circuit 470 compares processing data input 417 and processing data output 445 to a phase detector circuit 472. Phase detector circuit 472 compares processing data output 445 with processing data input 417 that yields a phase error value 473. Phase detector circuit 472 may be any circuit known in the art that is capable of determining a phase difference between one digital input and another digital input. Based upon the disclosure provided herein, one of ordinary skill in the art will recognize a variety of phase detector circuits that may be used in relation to different embodiments of the present invention. Phase error value 473 represents an amount that sampling clock 475 needs to be adjusted.

Phase error value 473 is provided to a loop filter circuit 474 that filters the update signal. FIG. 4B depicts an exemplary loop filter circuit 421 that may be used in relation to one or more embodiments of the present invention. Loop filter circuit 421 receives a phase error signal 422 that is multiplied by a frequency multiplier 423 using a multiplier circuit 426, and by a phase multiplier 434 using a multiplier circuit 434. The output of multiplier circuit 424 is provided to a summation circuit 425 where it is added to an accumulated phase value maintained in a phase memory 427, and the output of summation circuit 425 is stored back to phase memory 427. The output of phase memory 427 and multiplier circuit 426 are added using a summation circuit 428. The output of summation circuit 428 is provided to a summation circuit 429 where it is added to an accumulated frequency value maintained in a frequency memory 431, and the output of summation circuit 429 is stored back to frequency memory 431. The output of frequency memory 431 is provided as an offset 433. At the end of processing each bit of data, phase memory 427 holds a representation of the accumulated frequency and phase errors in frequency memory 431 and phase memory 427, respectively.

Loop filter circuit 474 provides a filtered error signal 477, and an inverse filtered error signal 479. Filtered error signal 477 is provide to a sampling frequency generator circuit 476. Sampling frequency generator circuit 476 adjusts sampling clock 475 based at least in part on filtered error signal 477. Sampling frequency generator circuit 476 may include an interpolator circuit and a time based generator circuit similar to that shown in FIG. 1. Based upon the disclosure provided herein, one of ordinary skill in the art will recognize a variety of frequency adjustment circuits that may be used in relation to different embodiments of the present invention.

Timing loop circuit 470 is referred to as "online" because it seeks to correct any sampling frequency output based upon synchronization and timing information received as part of data input 405 (e.g., acquisition mode on a hard disk drive system). Further, the gain of timing loop circuit 470 may be set to be relatively high to assure its ability to track a frequency of a short period of synchronization and timing information imbedded in data input 405. In one embodiment of the present invention, the synchronization and timing information is between forty and two hundred bit periods in length. In particular embodiments of the present invention, the synchronization and timing information is between sixty and one hundred bit periods in length.

Processing data input 417, inverse filtered error signal 479 and a data output 495 are provided to an offline timing loop circuit 460. Offline timing loop circuit 460 is operable to retime processing data input 417 using average frequency error information derived from a data output 495 to correct for any accumulating phase offset that was not corrected by online, high gain timing loop circuit 470. The retiming corrects for any mis-sampling including bit slips that may have occurred during initial data processing. Timing loop circuit 460 is referred to as "offline" as it works on a previously buffered series of data samples and not on data samples directly created from data input 405 (e.g., retry mode in a hard disk drive system). The retimed digital data samples are processed to yield a processing data output 465.

In particular, processing data input 417 and inverse filtered error signal 479 are provided to an interpolation circuit 491. Interpolation circuit 491 may be the same as the interpolation circuit included in sampling frequency generator circuit 476. Inverse filtered error signal 479 causes an interpolation in the opposite direction of that caused by filtered error signal 477. As such, the change in sampling frequency 475 caused by filtered error signal 477 is reversed by interpolation circuit 491. Said another way, interpolation circuit 491 reverts the effect of timing loop circuit 470 such that a data set provided to a data buffer 461 mimics data sampled using a free running sampling clock (i.e., a sampling clock that is not adjusted by a feedback loop). This assures that the data set maintained in data buffer 461 are uniformly spaced with a bit by bit phase error that can be calculated based upon a frequency error in the mimicked free running sampling clock. Data buffer 461 may be any memory device known in the art that is capable of storing a data set. In some cases, the data set is an LDPC codeword representing an entire sector of data from a magnetic storage medium.

A retimed data set 459 is provided from data buffer 461 to a digital interpolation circuit 462. Digital interpolation circuit 462 interpolates each sample of retimed data set 459 using an accumulating phase shift value 469. Phase shift value 469 is calculated for each bit of retimed data set using a feedback loop. The feedback loop includes a phase detector circuit 466 that compares a processing data input 463 (i.e., an output from digital interpolation circuit 462) with processing data output 465 (i.e., an output from a data detector circuit 464). Phase detector circuit 466 yields a phase error value 467. Phase detector circuit 466 may be any circuit known in the art that is capable of determining a phase difference between one digital input and another digital input. Based upon the disclosure provided herein, one of ordinary skill in the art will recognize a variety of phase detector circuits that may be used in relation to different embodiments of the present invention. Phase error value 467 represents an amount that phase shift value 469 is to be adjusted for interpolating the next sample of retimed data set 459. Phase error value 467 is provided to a loop filter circuit 468. Loop filter circuit 468 filters phase error value 467 and provides the filtered output as phase shift value 469. Loop filter circuit 468 may be implemented using the same architecture as loop filter circuit 474.

Data detector circuit 464 receives processing data input 463 and applies a detection algorithm thereto. In some cases, data detector circuit 464 may be implemented using the same data detector architecture of data detector circuit 420. In some embodiments of the present invention, data detector circuit 464 is a maximum a posteriori (MAP) detector circuit as are known in the art. Other types of detector circuits such as, for example, a Viterbi algorithm detector circuit may be used in relation to different embodiments of the present invention. Based upon the disclosure provided herein, one of ordinary skill in the art will recognize a variety of detector circuits that may be used in relation to different embodiments of the present invention. Data detector circuit 464 performs a detection process as is known in the art on processing data input 463 to yield processing data output 465. In addition, a soft data portion of data output 495 is provided as a soft input 452 to data detector circuit 464. Soft input 452 is available from a memory 451 that stores the soft portion of data output 495. Memory 451 may be any memory known in the art that is capable of storing a data set. Storing data output 495 in memory 451 assures that the data is available for use in relation to the processing of retimed data 459 by data detector circuit 464. By using data output 495 as a feedback to data detector circuit 464, an accurate interpolation by digital interpolation circuit 462 is enabled that provides a more accurate "sampling" of the data when compared with that controlled by online, high gain timing loop circuit 470.

In some cases, both processing data output 445 and processing data output 465 include an indication of a likely value at each bit position corresponding to data input 405, and corresponding soft data indicating a likelihood that the data at each bit position is correct. Both processing data output 445 and processing data output 465 are provided to an interleaver memory 443 that is responsible for buffering data, and providing either processing data output 445 or processing data output 465 as an decoder input 448 depending upon whether online or offline processing is selected. Thus, interleaver memory 443 may be implemented as a multiplexer with two buffered inputs. Based upon the disclosure provided herein, one of ordinary skill in the art will recognize a number of implementations for interleaver memory 443 that may be used in relation to different embodiments of the present invention. Decoder input 448 is provided to a low density parity check (LDPC) decoder circuit 450. LDPC decoder circuit 450 applies a decoding algorithm to decoding input 448, and provides the decoded result as data output 495. LDPC decoder circuit 450 may be any LDPC decoder circuit known in the art. Further, it should be noted that LDPC decoder circuit may be replaced with other types of decoder circuits known in the art such as, for example, a Reed Solomon decoder circuit. Based upon the disclosure provided herein, one of ordinary skill in the art will recognize a variety of decoder circuits that may be used in place of LDPC decoder circuit 450 in accordance with different embodiments of the present invention.

In operation, data input 405 is received. Online processing (i.e., on the fly processing) utilizes online, high gain feedback loop 470 to track the bit periods of the stream of data provided as data input 405. Data input 405 continues to be sampled using analog to digital converter 410 sampling at a rate dictated by sampling clock 475. The data is processed through DFIR 413, data detector circuit 420, and LDPC decoder circuit 450 to yield a data output. In some cases, the processing may be iterative with multiple passes through a data detector circuit and LDPC decoder circuit set(s).

In parallel, any phase shift applied in the sampling of analog to digital converter 410 is removed by performing a reverse interpolation by interpolation circuit 491. The resulting interpolated data is stored to a data buffer 461. This data maintained in data buffer 461 mimics data input 405 sampled using a free running clock (i.e., a clock of a constant frequency that is not adjusted by online, high gain feedback loop 470.

Where the data is found to be recoverable, offline processing is not performed. Alternatively, where the data is not recovered using online processing, offline processing is performed. Such offline processing includes providing retimed data set 459 from data buffer 461 to digital interpolation circuit 462. Retimed data set 459 is digitally interpolated using a digital interpolation circuit 462. The digital interpolation effectively adds an accumulating phase offset to each of the sampled of retimed data set 459 based upon a determined frequency offset. The frequency offset is determined by feeding back data output 495 to data detector circuit 464. Similar to online processing, offline processing can include iterative processing using multiple passes through a data detector circuit and LDPC decoder circuit set(s). Where the failure to recover was due to a bit slip or other sampling error, the retry process offers a reasonable expectation that the data can be recovered.

Figure 5:
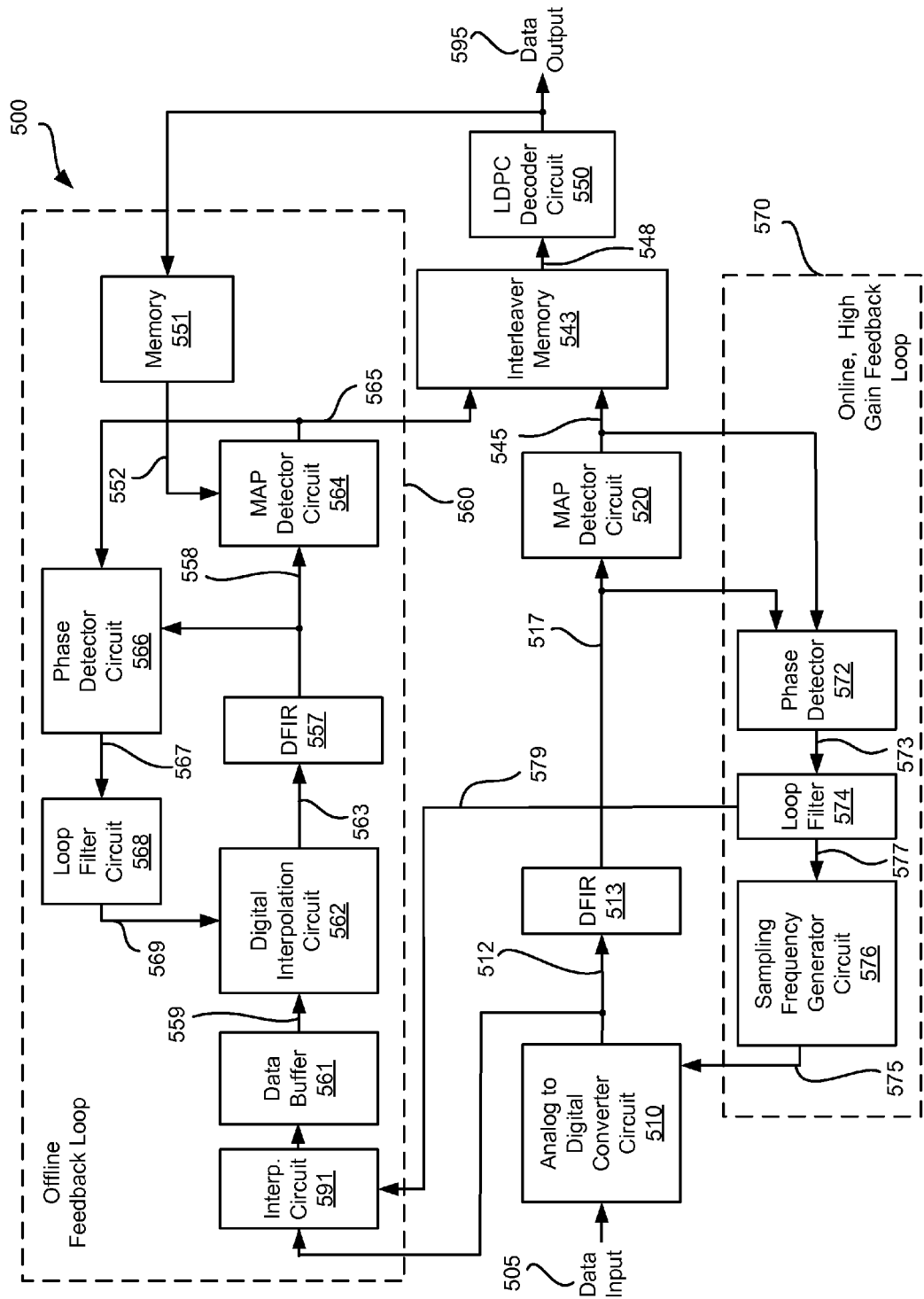
FIG. 5 shows yet another data processing circuit including a retimed virtual processing circuit in accordance with some embodiments of the present invention.

FIG. 5 shows another data processing circuit 500 including a retimed virtual processing circuit in accordance with some embodiments of the present invention. Data processing circuit 500 includes an analog to digital converter circuit 510 that receives a data input 505. Analog to digital converter 510 sample data input 505 and provides a series of digital samples 512 corresponding to sampling points dictated by a sampling clock 575. Analog to digital converter 510 may be any circuit that is capable of receiving an analog input signal and providing a series of data samples corresponding thereto. Based upon the disclosure provided herein, one of ordinary skill in the art will recognize a variety of analog to digital conversion circuits that may be used in relation to different embodiments of the present invention.

Digital samples 512 are provided to a filter circuit 513. In some embodiments of the present invention, filter circuit 513 is a digital finite impulse response filter as are known in the art. Based upon the disclosure provided herein, one of ordinary skill in the art will recognize a variety of filters that may be used in place of filter 513. Filter circuit 513 filters the received input and provides a series of filtered samples that are provided as a processing data input 517 to a data detector circuit 520. In some embodiments of the present invention, data detector circuit 520 is a maximum a posteriori (MAP) detector circuit as are known in the art. Other types of detector circuits such as, for example, a Viterbi algorithm detector circuit may be used in relation to different embodiments of the present invention. Based upon the disclosure provided herein, one of ordinary skill in the art will recognize a variety of detector circuits that may be used in relation to different embodiments of the present invention. Detector circuit 520 performs a detection process as is known in the art on processing data input 517 to yield a processing data output 545.

Both processing data input 517 and processing data output 545 are provided to an online, high gain timing loop circuit 570. Timing loop circuit 570 compares processing data input 517 and processing data output 545 to a phase detector circuit 572. Phase detector circuit 572 compares processing data output 545 with processing data input 517 that yields a phase error value 573. Phase detector circuit 572 may be any circuit known in the art that is capable of determining a phase difference between one digital input and another digital input. Based upon the disclosure provided herein, one of ordinary skill in the art will recognize a variety of phase detector circuits that may be used in relation to different embodiments of the present invention. Phase error value 573 represents an amount that sampling clock 575 needs to be adjusted.

Phase error value 573 is provided to a loop filter circuit 574 that filters the update signal. Loop filter circuit 574 may be implemented using the same architecture as loop filter circuit 474 discussed above in relation to FIG. 4B. Loop filter circuit 574 provides a filtered error signal 577, and an inverse filtered error signal 579. Filtered error signal 577 is provide to a sampling frequency generator circuit 576. Sampling frequency generator circuit 576 adjusts sampling clock 575 based at least in part on filtered error signal 577. Sampling frequency generator circuit 576 may include an interpolator circuit and a time based generator circuit similar to that shown in FIG. 1. Based upon the disclosure provided herein, one of ordinary skill in the art will recognize a variety of frequency adjustment circuits that may be used in relation to different embodiments of the present invention.

Timing loop circuit 570 is referred to as "online" because it seeks to correct any sampling frequency output based upon synchronization and timing information received as part of data input 505 (e.g., acquisition mode on a hard disk drive system). Further, the gain of timing loop circuit 570 may be set to be relatively high to assure its ability to track a frequency of a short period of synchronization and timing information imbedded in data input 505. In one embodiment of the present invention, the synchronization and timing information is between forty and two hundred bit periods in length. In particular embodiments of the present invention, the synchronization and timing information is between sixty and one hundred bit periods in length.

Digital samples 512, inverse filtered error signal 579 and a data output 595 are provided to an offline timing loop circuit 560. Offline timing loop circuit 560 is operable to retime digital samples 512 using average frequency error information derived from a data output 595 to correct for any accumulating phase offset that was not corrected by online, high gain timing loop circuit 570. The retiming corrects for any mis-sampling including bit slips that may have occurred during initial data processing. Timing loop circuit 560 is referred to as "offline" as it works on a previously buffered series of data samples and not on data samples directly created from data input 505 (e.g., retry mode in a hard disk drive system). The retimed digital data samples are processed to yield a processing data output 565.

In particular, digital samples 512 and inverse filtered error signal 579 are provided to an interpolation circuit 591. Interpolation circuit 591 may be the same as the interpolation circuit included in sampling frequency generator circuit 576. Inverse filtered error signal 579 causes an interpolation in the opposite direction of that caused by filtered error signal 577. As such, the change in sampling frequency 575 caused by filtered error signal 577 is reversed by interpolation circuit 591. Said another way, interpolation circuit 591 reverts the effect of timing loop circuit 570 such that a data set provided to a data buffer 561 mimics data sampled using a free running sampling clock (i.e., a sampling clock that is not adjusted by a feedback loop). This assures that the data set maintained in data buffer 561 are uniformly spaced with a bit by bit phase error that can be calculated based upon a frequency error in the mimicked free running sampling clock. Data buffer 561 may be any memory device known in the art that is capable of storing a data set. In some cases, the data set is an LDPC codeword representing an entire sector of data from a magnetic storage medium.

A retimed data set 559 is provided from data buffer 561 to a digital interpolation circuit 562. Digital interpolation circuit 562 interpolates each sample of retimed data set 559 using an accumulating phase shift value 569. Phase shift value 569 is calculated for each bit of retimed data set using a feedback loop. The feedback loop includes a phase detector circuit 566 that compares a processing data input 558 (i.e., an output from digital interpolation circuit 562) with processing data output 565 (i.e., an output from a data detector circuit 564). Phase detector circuit 566 yields a phase error value 567. Phase detector circuit 566 may be any circuit known in the art that is capable of determining a phase difference between one digital input and another digital input. Based upon the disclosure provided herein, one of ordinary skill in the art will recognize a variety of phase detector circuits that may be used in relation to different embodiments of the present invention. Phase error value 567 represents an amount that phase shift value 569 is to be adjusted for interpolating the next sample of retimed data set 559. Phase error value 567 is provided to a loop filter circuit 568. Loop filter circuit 568 filters phase error value 567 and provides the filtered output as phase shift value 469. Loop filter circuit 568 may be implemented using the same architecture as loop filter circuit 574.

Data detector circuit 564 receives processing data input 558. Processing data input 558 is an interpolated output 563 filtered by a filter circuit 557. In some embodiments of the present invention, filter circuit 557 is a digital finite impulse response circuit as are known in the art. Based upon the disclosure provided herein, one of ordinary skill in the art will recognize a variety of filter circuits that may be used in relation to different embodiments of the present invention. Data detector circuit 564 applies a detection algorithm to processing data input 558. In some cases, data detector circuit 564 may be implemented using the same data detector architecture of data detector circuit 520. In some embodiments of the present invention, data detector circuit 564 is a maximum a posteriori (MAP) detector circuit as are known in the art. Other types of detector circuits such as, for example, a Viterbi algorithm detector circuit may be used in relation to different embodiments of the present invention. Based upon the disclosure provided herein, one of ordinary skill in the art will recognize a variety of detector circuits that may be used in relation to different embodiments of the present invention. Data detector circuit 564 performs a detection process as is known in the art on processing data input 563 to yield processing data output 565. In addition, a soft data portion of data output 595 is provided as a soft input 552 to data detector circuit 564. Soft input 552 is available from a memory 551 that stores the soft portion of data output 595. Memory 551 may be any memory known in the art that is capable of storing a data set. Storing data output 595 in memory 551 assures that the data is available for use in relation to the processing of retimed data 559 by data detector circuit 564. By using data output 595 as a feedback to data detector circuit 564, an accurate interpolation by digital interpolation circuit 562 is enabled that provides a more accurate "sampling" of the data when compared with that controlled by online, high gain timing loop circuit 570.

In some cases, both processing data output 545 and processing data output 565 include an indication of a likely value at each bit position corresponding to data input 505, and corresponding soft data indicating a likelihood that the data at each bit position is correct. Both processing data output 545 and processing data output 565 are provided to an interleaver memory 543 that is responsible for buffering data, and providing either processing data output 545 or processing data output 565 as an decoder input 548 depending upon whether online or offline processing is selected. Thus, interleaver memory 543 may be implemented as a multiplexer with two buffered inputs. Based upon the disclosure provided herein, one of ordinary skill in the art will recognize a number of implementations for interleaver memory 543 that may be used in relation to different embodiments of the present invention. Decoder input 548 is provided to a low density parity check (LDPC) decoder circuit 550. LDPC decoder circuit 550 applies a decoding algorithm to decoding input 548, and provides the decoded result as data output 595. LDPC decoder circuit 550 may be any LDPC decoder circuit known in the art. Further, it should be noted that LDPC decoder circuit may be replaced with other types of decoder circuits known in the art such as, for example, a Reed Solomon decoder circuit. Based upon the disclosure provided herein, one of ordinary skill in the art will recognize a variety of decoder circuits that may be used in place of LDPC decoder circuit 550 in accordance with different embodiments of the present invention.

In operation, data input 505 is received. Online processing (i.e., on the fly processing) utilizes online, high gain feedback loop 570 to track the bit periods of the stream of data provided as data input 505. Data input 505 continues to be sampled using analog to digital converter 510 sampling at a rate dictated by sampling clock 575. The data is processed through DFIR 513, data detector circuit 520, and LDPC decoder circuit 550 to yield a data output. In some cases, the processing may be iterative with multiple passes through a data detector circuit and LDPC decoder circuit set(s).

In parallel, any phase shift applied in the sampling of analog to digital converter 510 is removed by performing a reverse interpolation by interpolation circuit 591. The resulting interpolated data is stored to a data buffer 561. This data maintained in data buffer 561 mimics data input 505 sampled using a free running clock (i.e., a clock of a constant frequency that is not adjusted by online, high gain feedback loop 570.

Where the data is found to be recoverable, offline processing is not performed. Alternatively, where the data is not recovered using online processing, offline processing is performed. Such offline processing includes providing retimed data set 559 from data buffer 561 to digital interpolation circuit 562. Retimed data set 559 is digitally interpolated using a digital interpolation circuit 562. The digital interpolation effectively adds an accumulating phase offset to each of the sampled of retimed data set 559 based upon a determined frequency offset. The frequency offset is determined by feeding back data output 595 to data detector circuit 564. Similar to online processing, offline processing can include iterative processing using multiple passes through a data detector circuit and LDPC decoder circuit set(s). Where the failure to recover was due to a bit slip or other sampling error, the retry process offers a reasonable expectation that the data can be recovered.

Figure 6:
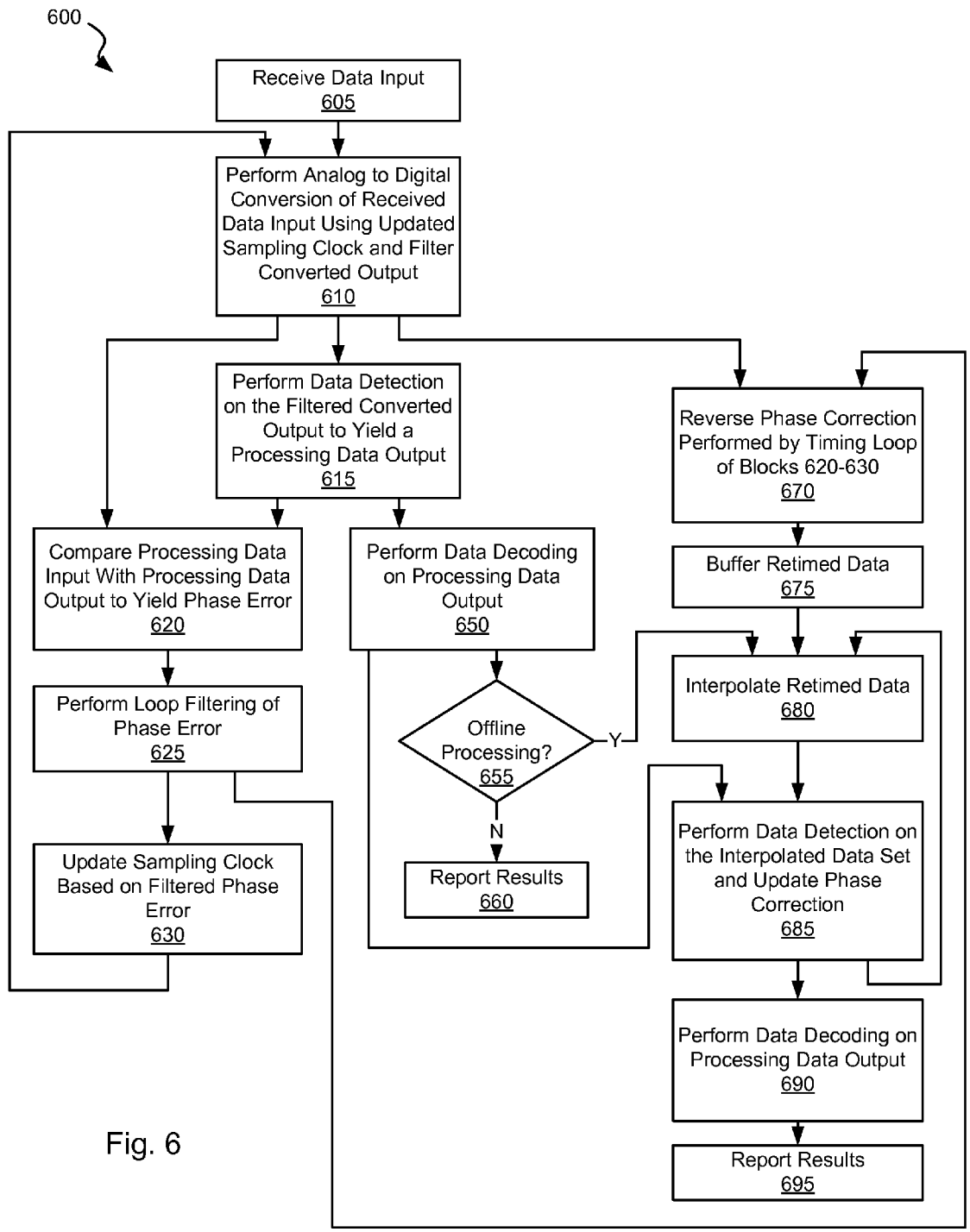
FIG. 6 is a flow diagram showing a method in accordance with some embodiments of the present invention for data processing including retimed virtual processing.

Turning to FIG. 6, a flow diagram 600 shows a method in accordance with some embodiments of the present invention for data processing including retimed virtual processing. Following flow diagram 600, a data input is received (block 605). The data input is an analog data input that may be received from any data source. As one example, the data input may be derived by sensing magnetic fields previously written to a magnetic storage medium. The data input is converted to an series of digital samples that each correspond to an updated sampling clock (block 610). The resulting series of data samples may be filtered before or after being provided to a timing loop. A data detection algorithm is applied to the filtered series of data samples to yield a processing data output (block 615).

An online timing loop (blocks 620-630) operates to update the sampling clock. In particular, the processing data input (e.g., the input to the data detector) is compared with the processing data output (e.g., the output of the data detector) to yield a phase error (block 620). The phase error is loop filtered (block 625), and the loop filtered phase error signal is used to update the sampling clock used to perform analog to digital conversion (block 630).

A data decoding algorithm is applied to the detected output (block 650). It is then determined whether offline processing is warranted or desired (block 655). For example, where application of the data decoding algorithm converges, offline processing is not needed. As another example, offline processing may be selectively disabled by the user. Where offline processing is not warranted or desired (block 655) the results of the decoding process are reported (block 660).

An online timing loop (blocks 620-630) operates to update the sampling clock. In particular, the processing data input (e.g., the input to the data detector) is compared with the processing data output (e.g., the output of the data detector) to yield a phase error (block 620). The phase error is loop filtered (block 625), and the loop filtered phase error signal is used to update the sampling clock used to perform analog to digital conversion (block 630).

Data from the analog to digital conversion (block 610) is interpolated to reverse the effects of any change in the phase of the sampling clock introduced by the online timing loop of blocks 620-630 (block 670). The interpolated data samples (i.e., the retimed data samples) are stored to a data buffer for use in a potential later offline (i.e., virtual) data processing (block 675). Where offline processing is called for (block 655), the retimed data is pulled from the buffer and each bit is interpolated to account for an average frequency offset between the sampled data and the desired data (block 680). The average frequency offset is assumed to occur uniformly across the entire data set and is determined by using the results of the previous data decoding process (block 650) fed back into an offline timing loop. In particular, the offline timing loop applies a data detection algorithm to the interpolated data set using soft data from the earlier application of the data decoding algorithm from block 650 (block 685). The interpolated data and the output from the data detection process are compared to determined a phase error that is loop filtered and fed back to control the amount of interpolation applied at block 680. A data decoding algorithm is applied to the result from the data detection process of block 685 (block 690), and the results of the decoding process are reported (block 695).

Figure 7:
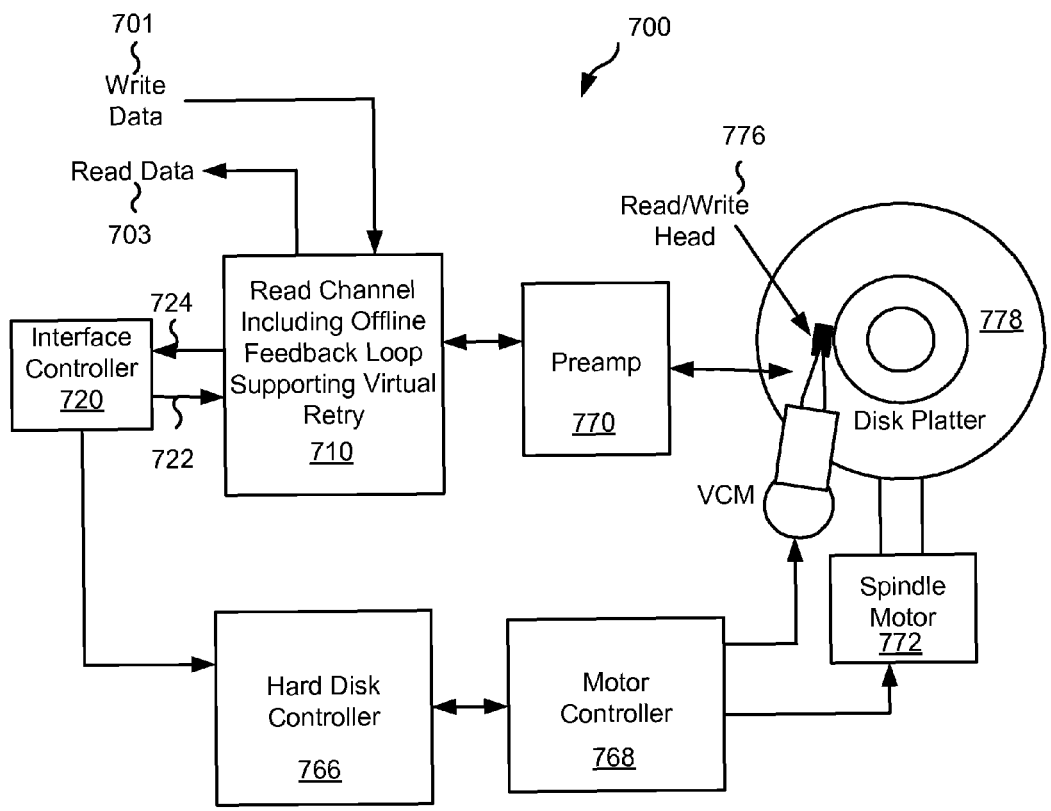
FIG. 7 depicts a storage system including a media defect detector circuit in accordance with various embodiments of the present invention.

Turning to FIG. 7, a storage system 700 including a read channel 710 with an enhanced media defect detection circuit is shown in accordance with various embodiments of the present invention. Storage system 900 may be, for example, a hard disk drive. Storage system 900 also includes a preamplifier 970, an interface controller 920, a hard disk controller 966, a motor controller 968, a spindle motor 972, a disk platter 978, and a read/write head 976. Interface controller 920 controls addressing and timing of data to/from disk platter 978. The data on disk platter 978 consists of groups of magnetic signals that may be detected by read/write head assembly 976 when the assembly is properly positioned over disk platter 978. In one embodiment, disk platter 978 includes magnetic signals recorded in accordance with a perpendicular recording scheme. Addressing source 990 supplies addresses to interface control 920 directing locations on disk platter 978 to which and from which data is to be respectively read and written. Defect information may be provided to a mapping control module (not shown) that is operable to receive indications of one or more regions of disk platter 978 that are defective, and to map the regions such that they are not used as is known in the art.

In a typical read operation, read/write head assembly 976 is accurately positioned by motor controller 968 over a desired data track on disk platter 978. Motor controller 968 both positions read/write head assembly 976 in relation to disk platter 978 and drives spindle motor 972 by moving read/write head assembly to the proper data track on disk platter 978 under the direction of hard disk controller 966. Spindle motor 972 spins disk platter 978 at a determined spin rate (RPMs). Once read/write head assembly 978 is positioned adjacent the proper data track, magnetic signals representing data on disk platter 978 are sensed by read/write head assembly 976 as disk platter 978 is rotated by spindle motor 972. The sensed magnetic signals are provided as a continuous, minute analog signal representative of the magnetic data on disk platter 978. This minute analog signal is transferred from read/write head assembly 976 to read channel module 910 via preamplifier 970. Preamplifier 970 is operable to amplify the minute analog signals accessed from disk platter 978. In turn, read channel module 910 decodes and digitizes the received analog signal to recreate the information originally written to disk platter 978. This data is provided as read data 903 to a receiving circuit. A write operation is substantially the opposite of the preceding read operation with write data 901 being provided to read channel module 910. This data is then encoded and written to disk platter 978.

The enhanced media defect detection circuit may be similar to those discussed above in relation to FIG. 2, FIG. 4 or FIG. 6, and/or may operate similar to that discussed above in relation to FIG. 3, FIG. 5 or FIG. 7. Such enhanced media defect detection circuits are capable of identifying media defects on disk platter 978.

In conclusion, the invention provides novel systems, devices, methods and arrangements for performing data processing system. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   an analog to digital converter operable to receive an analog input and to provide a first series of data samples, wherein each bit of the first series of data samples corresponds to the analog input at a time controlled by an updated sampling clock;
   an online timing loop operable to modify the updated sampling clock based at least in part upon a processed version of the first series of data samples; and
   an offline timing loop operable to interpolate a derivative of the first series of data samples to yield a second series of data samples, wherein the second series of data samples mimics a series of data samples corresponding to the analog input that were sampled using a free running clock; and wherein the second series of data samples is interpolated to adjust each bit in accordance with an average frequency offset exhibited across the second series of data samples.

2. The system of claim 1, wherein the system is implemented as part of a storage device.

3. The system of claim 2, wherein the storage device comprises:
   a read/write head assembly disposed in relation to a storage medium and operable to sense an information set on the storage medium and to yield a sensed signal, wherein the analog input is derived from the sensed signal.

4. The system of claim 3, wherein the storage device further comprises:
   an amplifier circuit operable to amplify the sensed signal to yield an amplified signal, wherein the analog input is derived from the amplified signal.

5. The system of claim 1, wherein the system further comprises:
   a data detector circuit operable to apply a data detection algorithm to a detector input derived from the first series of data samples to yield a third series of data samples; and
   wherein the online timing loop is operable to modify the updated sampling clock based on a phase error value derived by comparing the detector input to the third series of data samples.

6. The system of claim 5, wherein the data detector circuit is a maximum a posteriori data detector circuit.

7. The system of claim 5, wherein the data detector circuit is a first data detector circuit, wherein the data detection algorithm is a first data detection algorithm, wherein the detector input is a first detector input, and wherein the offline timing loop includes:
   a digital interpolator circuit operable to receive a second series of data samples and to provide an interpolated series of data samples;
   a second data detector circuit operable to apply a second data detection algorithm to a second detector input derived from the interpolated series of data samples to yield a fourth series of data samples;
   a phase detector circuit operable to determine a phase error by comparing the second detector input with the fourth series of data samples; and
   a loop filter operable to filter the phase error to yield a phase offset value that governs a phase offset applied by the digital interpolator circuit.

8. The system of claim 7, wherein the second detector input is the interpolated series of data samples.

9. The system of claim 7, wherein the second detector input is a filtered version of the interpolated series of data samples.

10. The system of claim 1, wherein the system is implemented as part of an integrated circuit.

11. A data processing system, the system comprising:
    an online timing loop operable to modify an updated sampling clock based at least in part upon a processed version of a first series of data samples; and
    an offline timing loop operable to interpolate a data set derived from the first series of data samples to yield a second series of data samples, wherein the second series of data samples mimics a series of data samples corresponding to an analog input that were sampled using a free running clock; and wherein the second series of data samples is interpolated to adjust each bit in accordance with an average frequency offset exhibited across the second series of data samples.

12. The system of claim 11, wherein the system further comprises:
    an analog to digital converter operable to receive the analog input and to provide the first series of data samples, wherein each bit of the first series of data samples corresponds to the analog input at a time controlled by the updated sampling clock.

13. The system of claim 12, wherein the system is implemented as part of a storage device.

14. The system of claim 13, wherein the storage device comprises:
a read/write head assembly disposed in relation to a storage medium and operable to sense an information set on the storage medium and to yield a sensed signal; and
an amplifier circuit operable to amplify the sensed signal to yield an amplified signal, wherein the analog input is derived from the amplified signal.

15. The system of claim 11, wherein the system further comprises:
a data detector circuit operable to apply a data detection algorithm to a detector input derived from the first series of data samples to yield a third series of data samples; and
wherein the online timing loop is operable to modify the updated sampling clock based on a phase error value derived by comparing the detector input to the third series of data samples.

16. The system of claim 15, wherein the data detector circuit is a maximum a posteriori data detector circuit.

17. The system of claim 15, wherein the data detector circuit is a first data detector circuit, wherein the data detection algorithm is a first data detection algorithm, wherein the detector input is a first detector input, and wherein the offline timing loop includes:
a digital interpolator circuit operable to receive a second series of data samples and to provide an interpolated series of data samples;
a second data detector circuit operable to apply a second data detection algorithm to a second detector input derived from the interpolated series of data samples to yield a fourth series of data samples;
a phase detector circuit operable to determine a phase error by comparing the second detector input with the fourth series of data samples; and
a loop filter operable to filter the phase error to yield a phase offset value that governs a phase offset applied by the digital interpolator circuit.

18. The system of claim 17, wherein the second detector input is selected from a group consisting of: the interpolated series of data samples, and a filtered version of the interpolated series of data samples.

19. The system of claim 11, wherein the system is implemented as part of an integrated circuit.

20. The system of claim 17, wherein the system further comprises:
a data decoder circuit operable to apply a data decoding algorithm to a decoder input and to provides a decoded output; and
an interleaver memory operable to provide either the fourth series of data samples or the third series of data samples as the decoder input depending upon whether online or offline processing is selected.

21. The system of claim 20, wherein the data decoder circuit is a low density parity check decoder circuit.

* * * * *